United States Patent
Bencivenga et al.

(10) Patent No.: US 7,161,786 B2
(45) Date of Patent: Jan. 9, 2007

(54) DATA SURGE PROTECTION MODULE (75) Inventors: Robert Bencivenga, Smithtown, NY (US); Matthew Wakeham, New York, NY (US); Yoshiharu Sueoka, Chula Vista, CA (US); Pieter Loftus, San Diego, CA (US)

(73) Assignee: Leviton Manufacturing Co., Inc., Little Neck, NY (US)

( * ) Notice: Subject to any disclaimer, the term of this patent is extended or adjusted under 35 U.S.C. 154(b) by 194 days.

(21) Appl. No.: 10/777,587

(22) Filed: Feb. 12, 2004

(65) Prior Publication Data

US 2004/0160724 A1 Aug. 19, 2004

Related U.S. Application Data (63) Continuation of application No. 09/903,213, filed on Jul. 11, 2001, now Pat. No. 6,692,270, which is a continuation of application No. 09/192,154, filed on Nov. 13, 1998, now Pat. No. 6,342,998.

(51) Int. Cl.
*H02H 9/06* (2006.01)

(52) U.S. Cl. .................. 361/119; 361/56; 361/111; 361/118

(58) Field of Classification Search ............... 361/118, 361/119, 111, 56
See application file for complete search history.

(56) References Cited

U.S. PATENT DOCUMENTS

| 4,389,695 | A |   | 6/1983 | Carpenter, Jr. |
| 5,353,189 | A | * | 10/1994 | Tomlinson ................ 361/118 |
| 5,377,067 | A |   | 12/1994 | Tanakan et al. |
| 5,563,761 | A |   | 10/1996 | Apa et al. |
| 5,674,079 | A |   | 10/1997 | Auclair |
| 5,706,160 | A | * | 1/1998 | Latuszkin et al. .......... 307/119 |
| 5,717,561 | A |   | 2/1998 | Peng |
| 5,963,121 | A | * | 10/1999 | Stygar et al. ............... 337/155 |
| 6,072,683 | A | * | 6/2000 | Masghati .................... 361/119 |
| 6,095,856 | A |   | 8/2000 | Horan et al. |
| 6,692,270 | B1 |   | 2/2004 | Bencivenga et al. |

* cited by examiner

*Primary Examiner*—Brian Sircus
*Assistant Examiner*—Terrence Willoughby
(74) *Attorney, Agent, or Firm*—Paul J. Sutton (57) ABSTRACT

A data surge protection module which can be added to data and control networks not having such protection. The use of quick connect/disconnect connectors allows the rapid installation or replacement of such modules. a built in ground plate and a braided low impedance conductor offer alternative grounding methods for the module. The module employs two or more diode steering bridges and uses a diode as the surge suppression element.

1 Claim, 8 Drawing Sheets

DATA SURGE PROTECTION MODULE

This application is a continuation of application Ser. No. 09/903,213 filed Jul. 11, 2001, now U.S. Pat. No. 6,692,270 which is a continuation of application Ser. No. 09/192,154 filed Nov. 13, 1998, now U.S. Pat. No. 6,342,998.

BACKGROUND OF THE INVENTION

1. Field of the Invention

The invention is directed to the field of electrical voltage surge protection and more particularly to providing surge protection for data communication circuits.

2. Description of the Prior Art

Prior art surge protectors for programmable logic controllers (PLC's) or similar devices, are complex to use and require the attachment of various grounds, conductors and jumpers to protect data communication circuits. This makes the replacement of the surge protector difficult and time consuming.

SUMMARY OF THE INVENTION

The instant invention overcomes the difficulties noted above with respect to the prior art. The instant invention employs a housing with two complementary ground connects. The first is a notched plate capable of accepting the shaft of an attachment bolt. This bolt fastens the housing ground plate to a ground system. The second ground connection is implemented via a low impedance ground strap. The ground strap is used when dimensional constraints prevent the direct bolting of the notched plate to a ground system. The input data conductors are coupled to a plug-in connector which is received in a suitable header on the housing. The output data conductors are also coupled to a plug-in connector which is received in a suitable header on the housing. The use of the plug-in connectors makes the connection to and from the module quick and easy. A number of diode steering bridges couples selected lines to a silicon avalanche diode (SAD) which provides surge protection to one another to protect against surges, line to line, and line to ground. The SAD mounted at the bridge output is the surge suppression element for transient voltage surges. Certain of the input data lines are also fused with automatically resettable positive temperature co-efficient devices contained in the housing.

BRIEF DESCRIPTION OF THE DRAWING

In the drawings in which similar elements are given similar reference characters.

DESCRIPTION OF THE PREFERRED EMBODIMENTS

Figure 1:
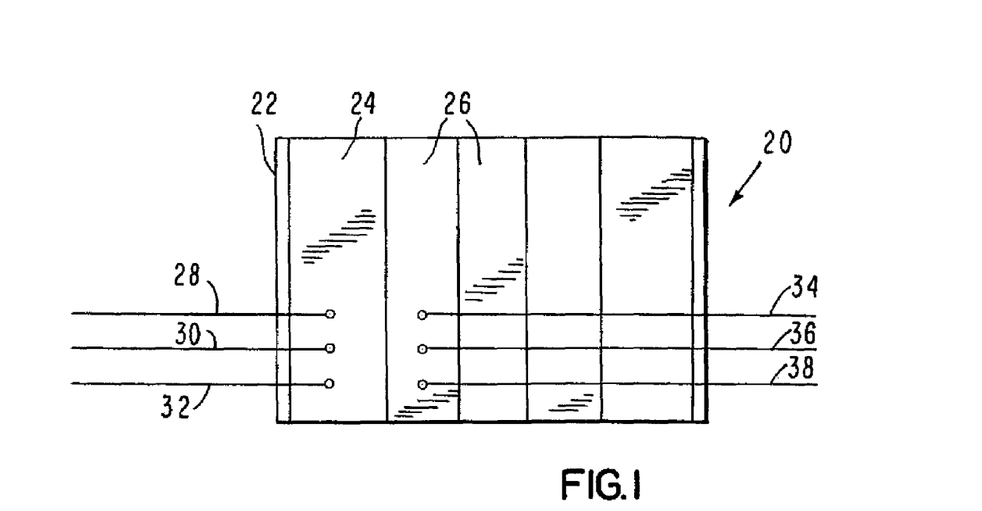
FIG. 1 is a front elevational view of a programmable logic device, hereafter "PLC" and a plurality of side card modules in an enclosure.

Referring to FIG. 1 there is shown a PLC 24 mounted in a housing 22 of signal loop network 20. Also mounted in enclosure 22 are a number of "side card" modules 26 which act as input/output control devices. The PLC 24 is connected to a mother board (not shown) across the back of enclosure 22 and the individual side card modules, or daughter boards 26 are connected to the mother board to receive operating voltages and signals. The input lines 28, 30 and 32 from a computer or the like are coupled to the PLC 24 and the output lines 34, 36 and 38 extend from the first side card module 26 to a circuit to controlled devices, for example, for turning an electrical motor on or off. No surge protection is provided to the PLC or the side card modules 26 and they may be damaged or destroyed by a transient voltage surge.

Figure 2:
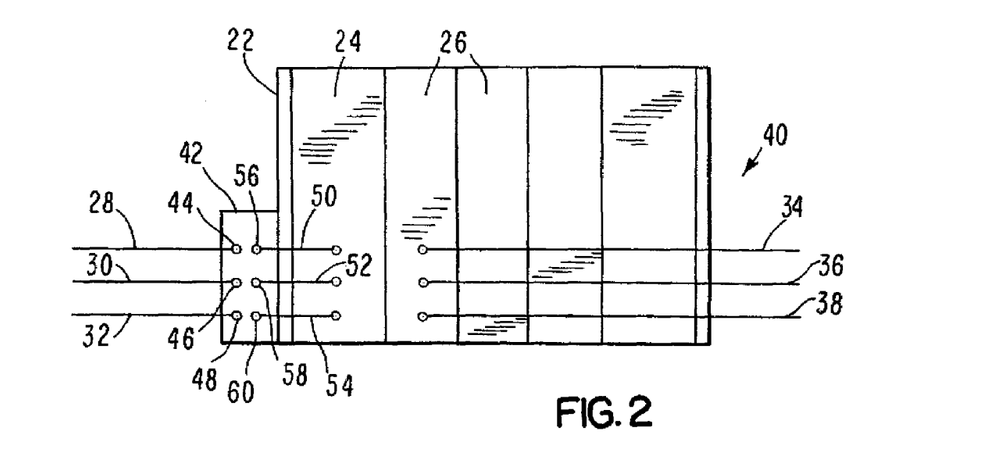
FIG. 2 is a front elevational view of the device of FIG. 1, with an electrical voltage surge protection module attached to the enclosure but turned 90° to better illustrate the connections to the module.

FIG. 2 shows the same arrangement of PLC 24 and side card modules 26 in an enclosure 22 but with an electrical voltage surge protection module 42 added to enclosure 22 to provide signal loop network 40. Lines 28, 30 and 32 are removed from the input terminals of the PLC 24 and are coupled to the input terminals 44, 46 and 48 of the module 42. Lines 50, 52 and 54 are coupled between output terminals 56, 58 and 60 of the module 42 and the input terminals of the PLC 24. This wiring of the module 42 places it in series between the input lines 28, 30, 32 and the input terminals of the PLC and provides transient voltage surge protection at this point.

Figure 3:
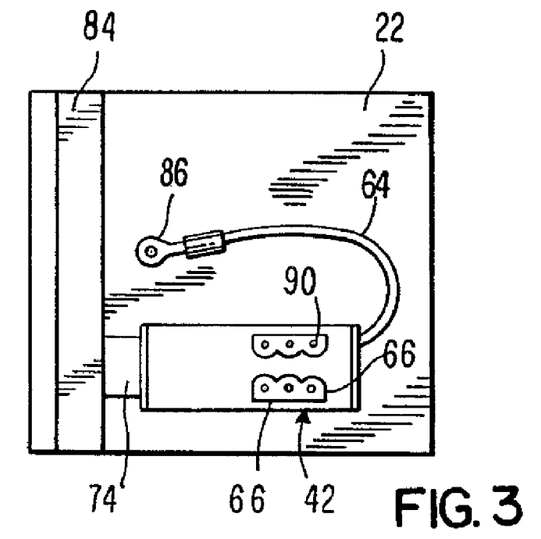
FIG. 3 is a side elevational view of the enclosure of FIG. 2 with a module attached and grounded by means of a ground plate on the module and a ground strap on the enclosure.
Figure 4:
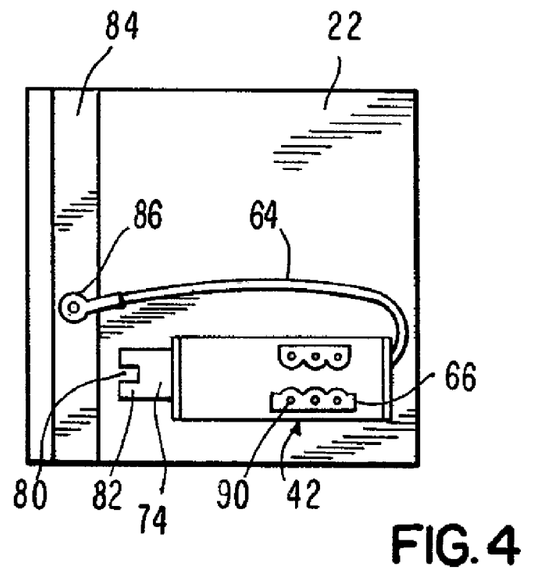
FIG. 4 is a side elevational view of the enclosure of FIG. 2 with a module attached and grounded by means of a pigtail of braided metal coupled to the enclosure.
Figure 11:
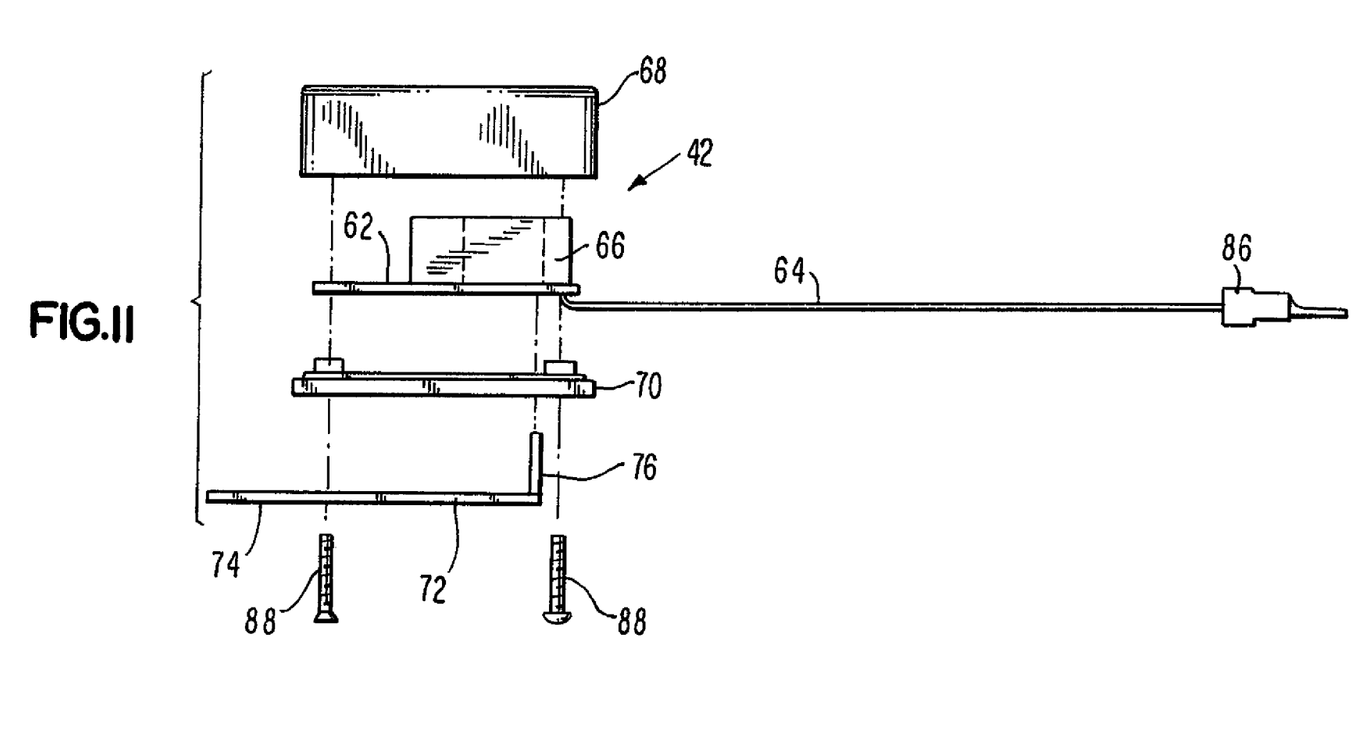
FIG. 11 is an exploded side elevational view of a module according to the invention.

Turning now to FIGS. 3, 4 and 11 the manner of mounting and grounding the module 42 is shown. Module 42 has a PCB 62, shown in FIG. 11, upon which the circuit components are located and to which is fastened a braided low impedance alternate ground wire 64. Also present on the PCB 62 are two 3-pin headers or multi-pin connectors 66, only one of which is visible in FIG. 11. For six conductor constructions two 6-pin headers or multi-pin connectors are used as will be explained below. The PCB 62 is placed in a housing made up of a top housing portion 68 and a base portion 70. A grounding plate 72 (FIG. 11) has a plug-in tongue 74 at one end and an upturned tab 76 at an opposite end. Tab 76 extends through base portion 70 of the housing and into the PCB 62 where it is soldered to the PCB 62. The plug-in tongue 74 is best seen in FIG. 11 is attached to the top housing portion 68 via base portion 70 by means of a bolt 88. It is generally rectangular in shape and has cut-out 80 to provide two tongues 82 (see FIG. 3) which can be plugged into a grounding stud 84 on the side of enclosure 22 as is shown in FIGS. 3 and 4. The module 42 is assembled by the use of two threaded fasteners 88 as shown by the dashed lines in FIG. 11.

Figure 5:
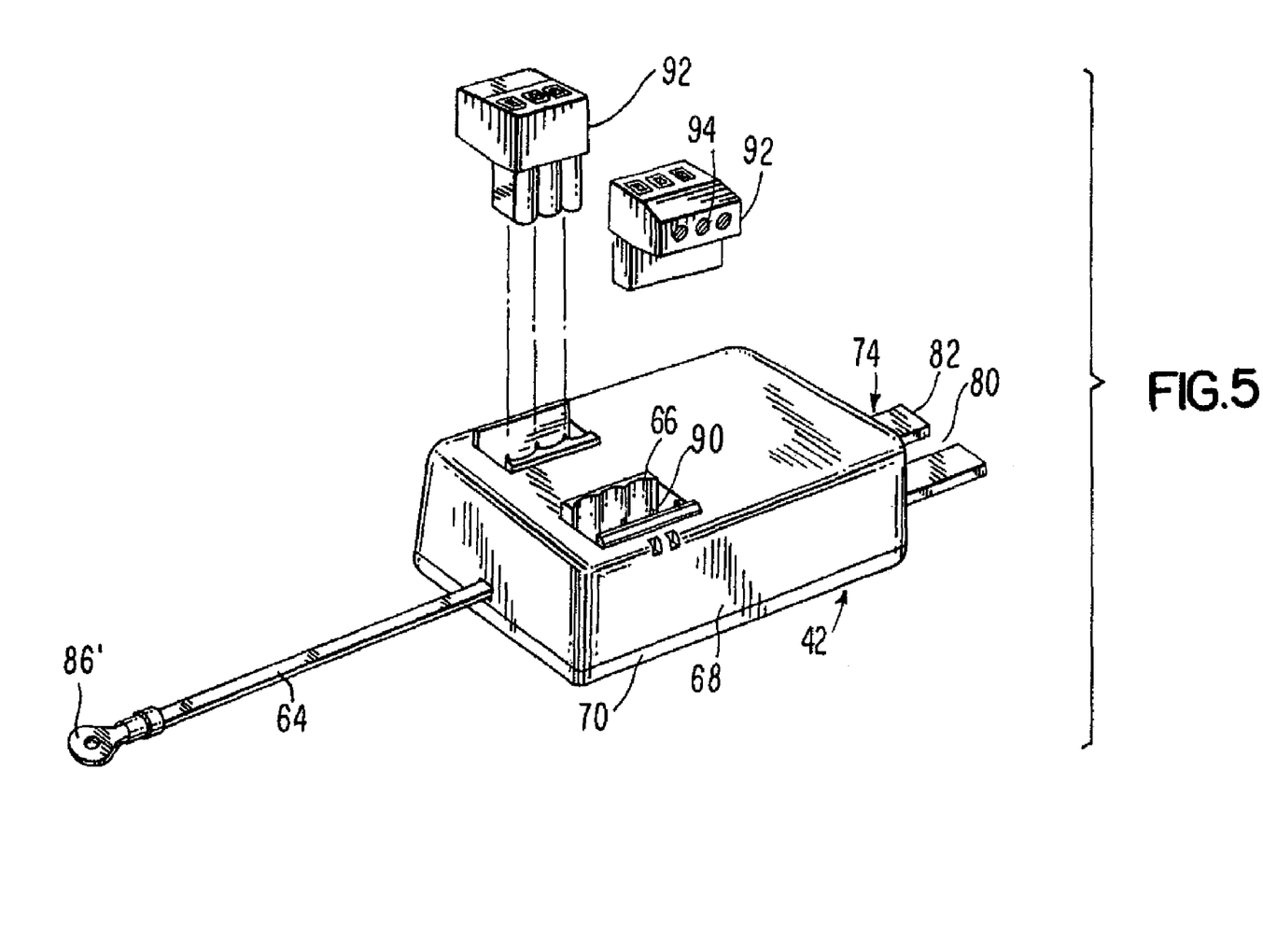
FIG. 5 is an exploded, perspective view of the module and its quick connect/disconnect connectors for three data input lines and three data output lines.
Figure 6:
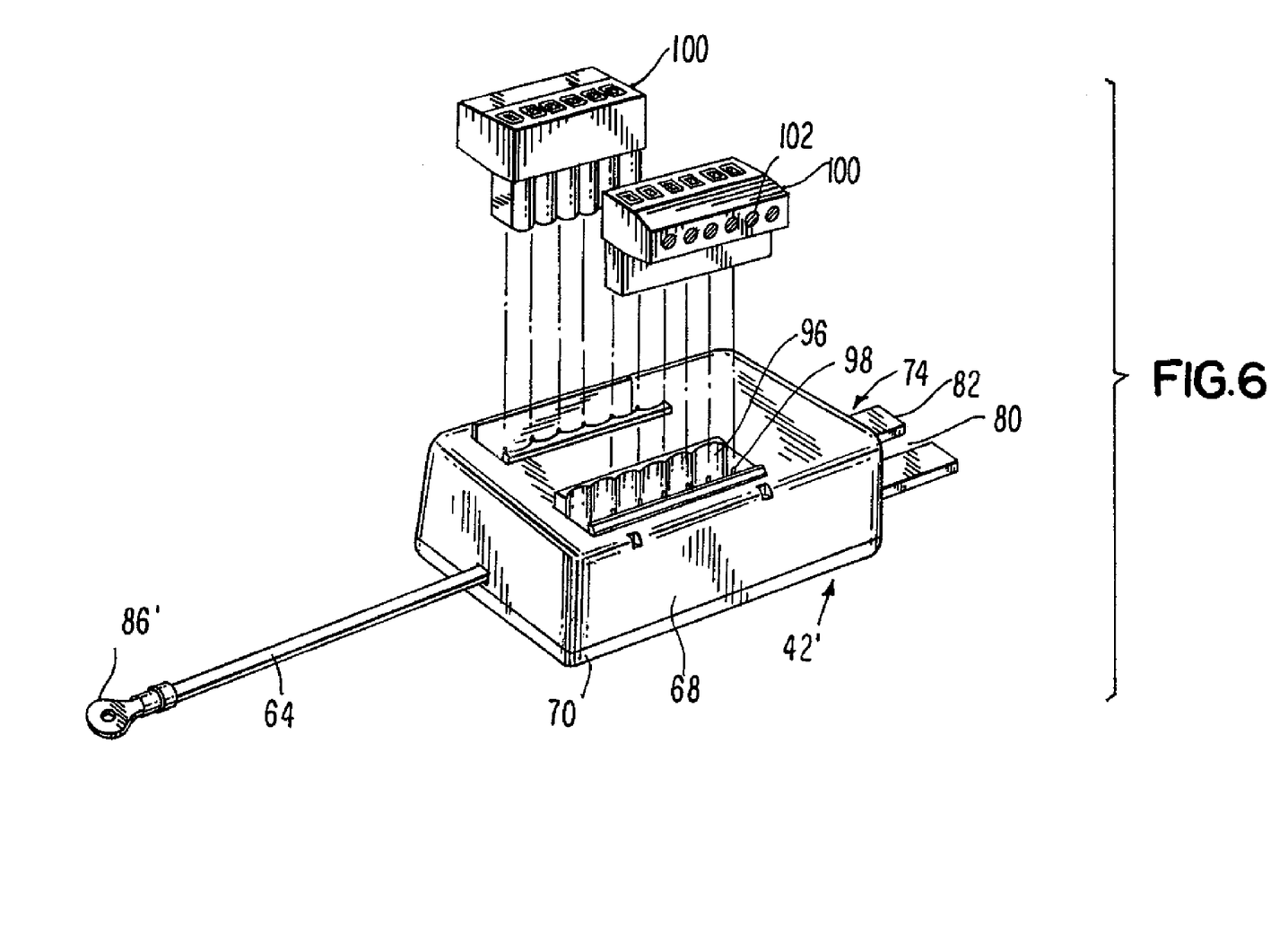
FIG. 6 is an exploded, perspective view of the module and its quick connect/disconnect connectors for six data input lines and six data output lines.
Figure 7:
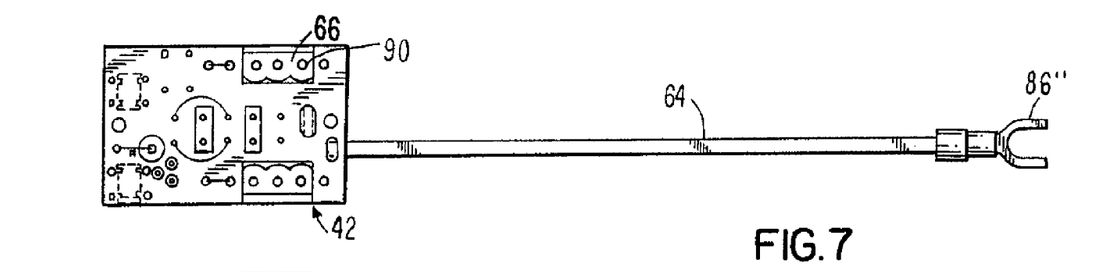
FIG. 7 is a top plan view of the printed circuit board (hereafter "PCB") for a three data line module.
Figures 8, 9:
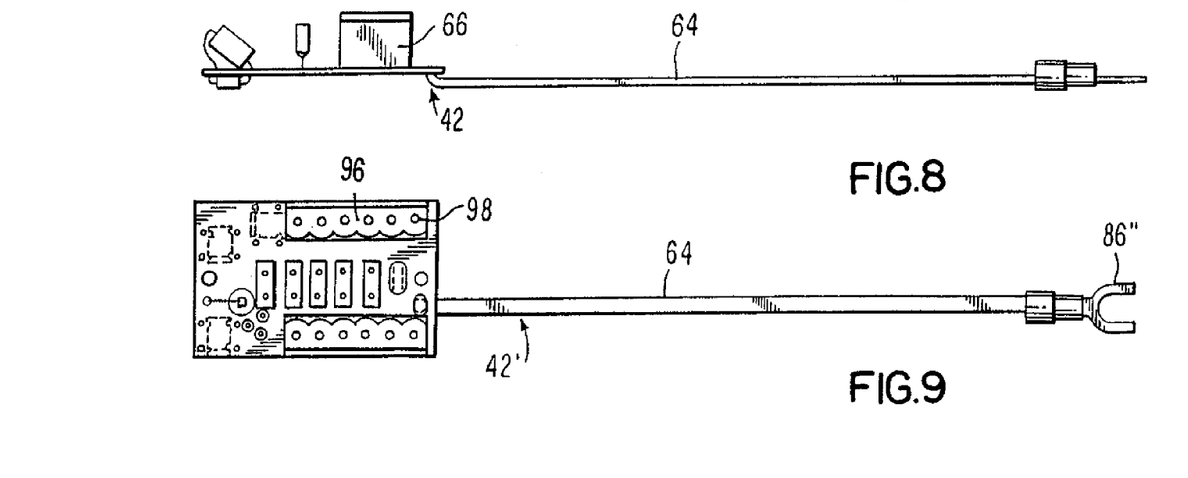
FIG. 8 is a side electrical view of the PCB of FIG. 7.
FIG. 9 is a top plan view of the PCB for a six data line module.
Figure 10:
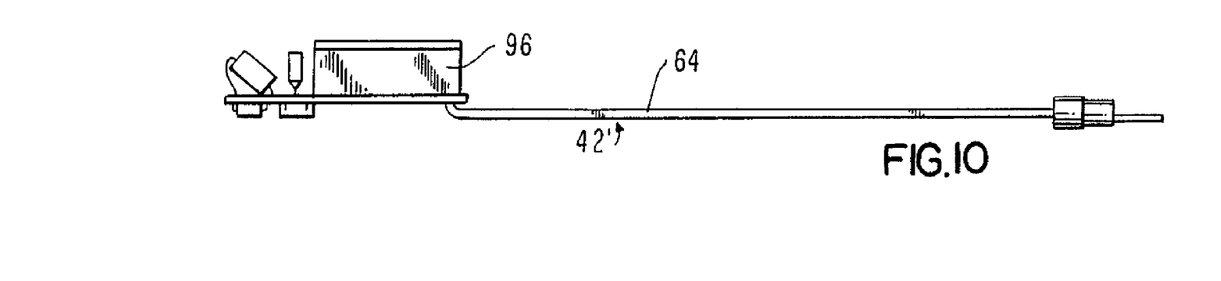
FIG. 10 is a side elevational view of the PCB of FIG. 9.

The alternative ground attachment braided conductor 64 is not used in the arrangement of FIG. 3 and may be cut-off and discarded or can be retained if desired. In the event no clearance space is available to attach module 42 to the grounding stud 84 the module 42 may be mounted to the enclosure 22 and to the grounding stud 84 by means of braided low impedance conductor 64. The conductor 64 is terminated in a connector 86 which may be a ring terminal 86' as shown in FIG. 5 or a spade terminal 86" as shown in FIGS. 7 and 9. Connector 86 is held in place by a suitable fastener. The module 42 can be fastened to enclosure 22 by a crimp type fastener, bonding, pressure sensitive tape, brazing, welding or the like.

Referring to FIGS. 5 to 11 the module 42 for use with three conductor cables and the module 42' for use with six conductor cables in shown. The three pin header 66 has three vertical pins 90 which mate with three sockets (not shown) of a 3 pin quick connect/disconnect multi-conductor connector or terminal connector 92. Conductors such as 28, 30 and 32 can be fastened to a 3 pin terminal connector 92 using the screw fasteners 94. In a similar fashion, the module 42' has two six pin headers 96 each with six vertical pins 98. The pins 98 mate with six sockets (not shown) of a 6 pin quick connect/disconnect multi-conductor connector or terminal connector 100. Conductors can be fastened to the terminal connector 100 by use of the screw fasteners 102.

Figure 12:
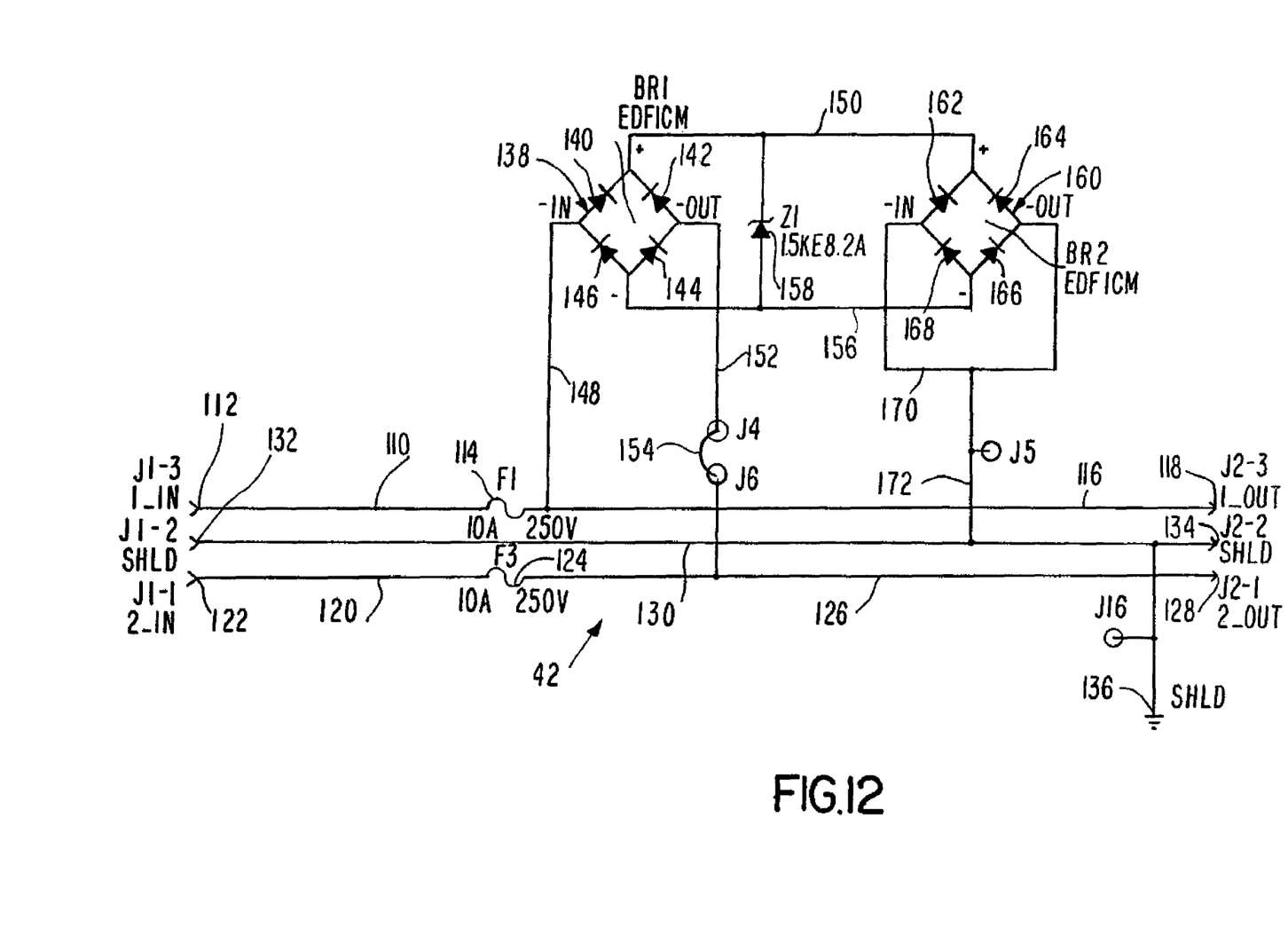
FIG. 12 is a schematic drawing of a circuit for protecting a module with three data lines.

Referring now to FIG. 12, the circuitry for a three conductor electrical voltage surge protection module 42 is shown. A conductor 110 extends from an input J1-3 line 1 IN terminal 112 to one side of a PTC fuse 114 rated at 10 amps at 250 volts. The other side of fuse 114 is connected by conductor 116 to output terminal 118 marked schematically as J2-3 1 OUT. The conductors 110, 116 and fuse 114 constitute one signal line from the computer or similar device to a PLC. Conductor 120 extends from input terminal 122 marked J1-1 2 IN to one side of PTC fuse 124. The other side of fuse 124 is connected by conductor 126 to output terminal 128 marked J2-1 2 OUT. The conductors 120, 126 and fuse 124 constitute a second signal line. A third line 130 extends from input terminal 132 marked J1-2 SHLD to output terminal 134 marked J2-2 SHLD. This is the shield line conductor from the input cable that is passed through the device to the output cable and is grounded as at 136.

A first steering bridge 138 is made up of four diodes 140, 142, 144 and 146. The anode of diode 140 is connected to the cathode of diode 146 and to line 148 to conductor 116. The cathode of diode 140 is connected to the cathode of diode 142 and to a line 150. The anode of diode 142 is connected to the cathode of diode 144, this junction is connected to line 152 to conductor 126. Line 152 may be a single line or made up of two sections jumpered together as at 154. The anode of diode 144 is connected to the anode of diode 146. This junction is connected to line 156. A SAD 158 is connected with its cathode connected to line 150 and its anode connected to line 156. The SAD 158 provides the transient voltage suppression for lines 110, 116 and 120, 126, respectively, as will be set forth below.

A second steering bridge 160 is made up of four diodes 162, 164, 166 and 168. The anode of diode 162 is connected to the cathode of diode 168. This junction is connected to line 170. The cathode of diode 162 is coupled to the cathode of diode 164. This junction is connected to line 150. The anode of diode 164 is connected to the cathode of diode 166. This junction is connected to line 170. Line 170 is connected by conductor 172 to shield line 130. The anode of diode 166 is connected to the anode of diode 168. This junction is connected to line 156.

A positive transient voltage on line 110 greater than the breakover point of diode 158 and less than current level of fuse 114 will be conducted from terminal 112, conductor 110, fuse 114 to the line 148 to the anode of diode 140. Diode 140 will conduct and place this transient on line 150. The current with pass through the diode 158 from cathode to anode and to line 156 and to the junction of the anodes of diodes 166 and 168. The transient is passed by lines 170 and 172 to the shield line 130 which is grounded, thereby shunting the excess transient current to ground.

A negative transient voltage of sufficient magnitude on line 110 from terminal 112 passes fuse 114 and is applied to line 148 and in turn to the cathode of diode 146. The transient then passes from the cathode of diode 146 is applied to line 156, through the diode 158 from anode to cathode to line 150. The transient output on line 150 is divided by the diodes 162, 164 whose cathodes are connected to line 150 and anodes are connected to line 170 then to line 172 to the grounded shield conductor 130.

A positive transient voltage signal incurred between line 120 and ground or between lines 120 and 130 passes from terminal 122, along line 120 through fuse 124 to line 152. The signal continues from the anode to the cathode of diode 142 to line 150 to diode 158. The transient signal then passes through diode 158 from cathode to anode and to line 156. Line 156 applies the signal to the anodes of diodes 166, 168. The cathodes of diodes 166 and 168 are each connected by line 170 to line 172 to the grounded shield conductor 130.

A negative transient voltage signal incurred between line 120 and ground or between lines 120 and 130 passes through fuse 124 to line 152. The signal passes from cathode to anode of diode 144, to line 156 and through diode 158 from anode to cathode to line 150. The signal on line 150 is applied to the cathodes of diodes 162, 164 whose anodes provide signals to transient lines 170, 172 to the grounded shield line 130. This arrangement provides transient voltage surge protection for line to line and line to ground surges.

Figure 13:
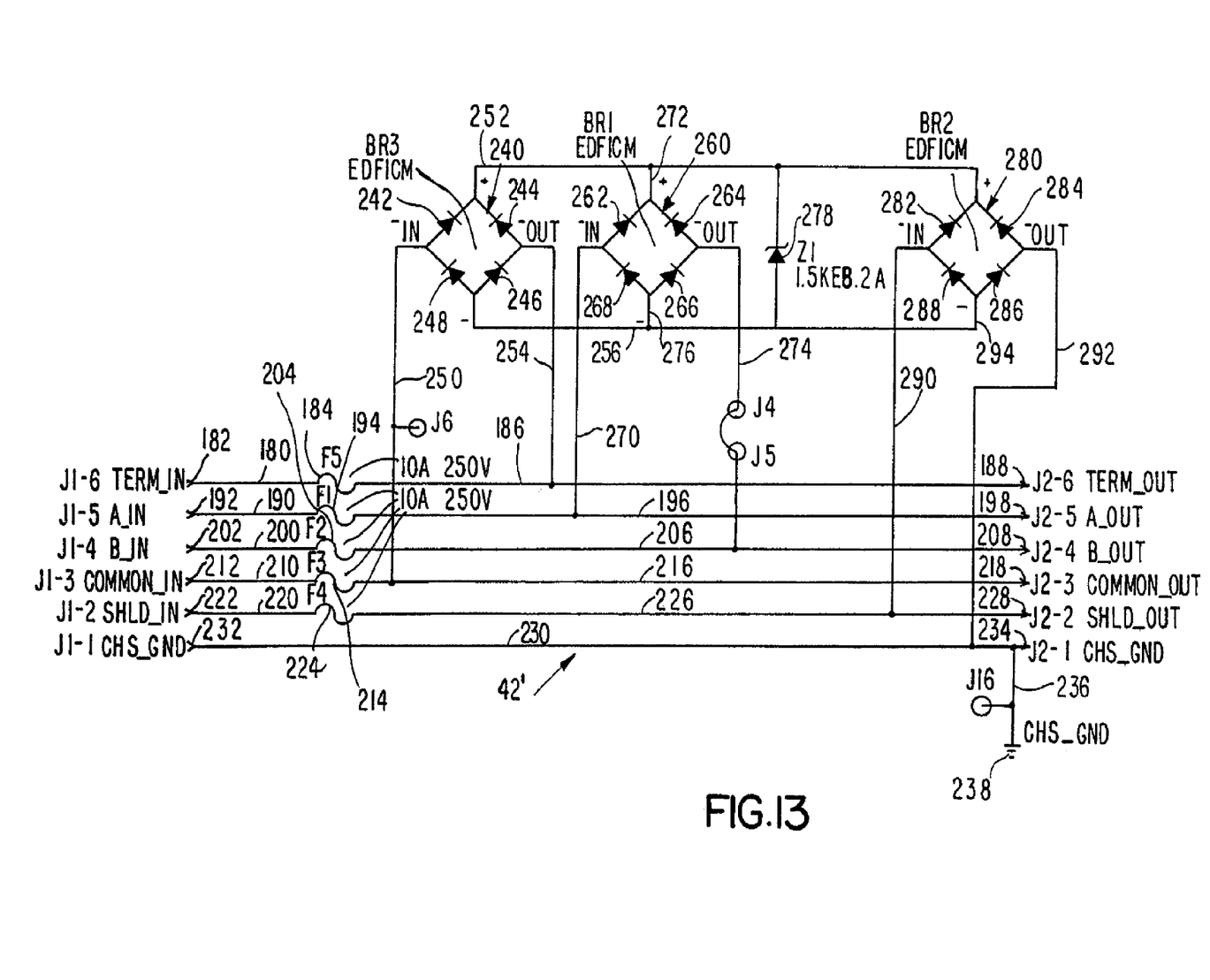
FIG. 13 is a schematic drawing of a circuit for protecting a module with six data lines.

The circuitry for a six conductor electrical voltage surge protection module 42' is shown in FIG. 13. Line 180 from input terminal 182 marked J1-6 TERM IN is input to fuse 184 the output of which is connected by conductor 186 to output terminal 188 marked J2-6 TERM OUT. The conductors 180, 186 connect to an external resistor (not a part of this device) which terminates the module 42' data line to the PLC. Conductor 190 extends from input terminal 192 marked J1-5 A IN to fuse 194 which is also connected to conductor 196 which extends to output terminal 198 marked J2-5 A OUT. This is a first signal line.

Conductor 200 extends from input terminal 202 marked J1-4 B IN to fuse 204 and from fuse 204 via conductor 206 to output terminal 208 marked J2-4 B OUT which is the second signal line. Conductor 210 extends from input terminal 212 marked J1-3 COMMON IN to fuse 214, conductor 216 to output terminal 218 marked J2-3 COMMON OUT. This is the return line for both of the signal lines A and B. From input terminal 222 marked J1-2 SHLD IN, conductor 220 connects to fuse 224 to conductor 226 to output terminal 228 marked J2-2 SHLD OUT. A chassis ground line 230 extends from input terminal 232 marked J1-1 CHS GND to output terminal 234 marked J2-1 CHS-GND. Line 230 is tied to chassis ground 238 by conductor 236.

A first steering bridge 240 is composed of four diodes 242, 244, 246 and 248. The anode of diode 242 is coupled to the cathode of diode 248 and to line 250 connected at its other end to the common line 216. The cathode of diode 242 is connected to the cathode of diode 244 and to line 252. The anode of diode 244 is coupled to the cathode of diode 246 and to line 254 coupled to the termination line 186. The anode of diode 246 is coupled to the anode of diode 248 and to a line 256. A second steering bridge 260 is made up of four diodes 262, 264, 266 and 268. The anode of diode 262 is coupled to the cathode of diode 268 and to a line 270 connecting to the A IN signal line 196. The cathode of diode 262 is connected to the cathode of diode 264 and by line 272 to line 252. The anode of diode 264 is connected to the cathode of diode 266 and line 274 to the B IN signal line 206. The anode of diode 266 is connected to the anode of diode 268 and by line 276 to line 256. A diode 278 has its anode coupled to line 256 while its cathode is coupled to line 252.

A third steering bridge 280 is made up of four diodes 282, 284, 286 and 288. The anode of diode 282 is coupled to the cathode of diode 288 and to line 290 connected to shield line 226. The cathode of diode 282 is connected to the cathode of diode 284 and to line 252. The anode of diode 284 is connected to the cathode of diode 286 and by line 292 to chassis ground line 230. The anode of diode 286 is connected to the anode of diode 288 and by line 294 to line 256.

A positive transient voltage surge pulse incurred between input terminal 182 and input terminal 222 or between terminals 182 and 212 would pass along conductor 180 through fuse 184, line 254 to the anode of diode 244, the cathode of diode 244 to line 252 to the cathode of the diode 278. From the anode of the diode 278 the signal passes to line 256 to the anodes of diodes 286, 288. The signal through diode 286 passes from its anode to line 292 to chassis ground conductor 230 while the signal through diode 288 passes from its cathode to line 290 to shield conductor 226. For terminal A IN positive transient voltage surge pulses incurred between terminals 192 and 202 or 192 and 182 or 192 and 212 on terminal 192. The transient is conducted along conductor 190 to fuse 194. From fuse 194 the transient travels along line 196 to line 270 to the anode of diode 262, the cathode of diode 262 the line 272 to the line 252 and the cathode of diode 278. From the anode of diode 278 the pulse travels along line 256 to the anodes of the diodes 286 and 288 whose cathodes steer the transient to chassis ground line 230 and the shield line 226, respectively. For a transient pulse incurred between lines 200 and 190, 200 and 210 or 200 and 180 the flow is via B IN signal line 200 to input terminal 202 to fuse 204 to line 274 to the anode of diode 264 whose output at the cathode is applied over line 272 to line 252 and through diode 278 from cathode to anode to line 256. This signal divides between diodes 286 and 288, as explained above, and is coupled to the chassis ground conductor 230 and the shield conductor 226. The application of a transient pulse to terminal 212 of conductor 210 is passed through fuse 214 to the anode of diode 242, the cathode of diode 242, line 252 to the diode 278. The remainder of this circuit is the same as described with respect to the A IN signal line 196 described above. A surge transient on shield line 220 from input terminal 222 is coupled by fuse 224 to line 226 and by line 290 to the anode of diode 282, through diode 282 to the line 252 and through the diode 278, cathode to anode to line 256 to line 294 to the anode of diode 286 and from the cathode of diode 286 to the chassis ground conductor 230. The chassis ground line 230 is directly connected to an equipment ground and will ground any surge pulse applied to it.

A negative transient voltage surge pulse incurred between terminals 182 and 212, or 182 and 222 or 182 and 232 is conducted through conductor 180, fuse 184 to line 254, through diode 246 from cathode to anode, line 256 to diode 278 where it passes anode to cathode to the cathodes of diodes 282 and 284. The signal divides with a portion applied to each diode. The anode of diode 282 is coupled by line 290 to the shield line 226 while the anode of diode 284 is connected by line 292 to the chassis ground line 230. A negative transient voltage surge pulse incurred between terminals 192 and 202, 192 and 222, or 192 and 232 is conducted through terminal 192 as the A IN terminal along conductor 190, through fuse 194 to line 270 to the cathode of diode 268. From the anode of diode 268 the pulse travels along line 276 to line 256 to diode 278 where it passes from anode to cathode to the line 252 and the juncture between diodes 282, 284 which operate in the same manner as set forth above with respect to the termination line 150. A negative transient voltage surge pulse incurred between terminals 202 and 192, 202 and 222, or 202 and 232 is conducted from input terminal J1-4B IN to signal line 200 from terminal 202 is conducted through fuse 204 to conductor 206. From conductor 206 it passes along line 274 to the cathode of diode 266, from the anode of diode 266 along line 276 to line 256 to the diode 278. The further connections are as described above. When the common line 210 incurs a negative transient voltage surge pulse between terminals 212 and 222 and 212 and 232 it is conducted via terminal 212 by fuse 214 to conductor 216. From conductor 216 the pulse passes along line 250 to the cathode of diode 248, from the anode of diode 248 to the line 256 to the diode 278 and through the diodes 282 and 284 as explained above. The presence of a negative surge pulse on the shield conductor 226 from terminal 222 via fuse 224 and lines 226 and 290 is applied to the cathode of diode 288. The diode conducts via its anode to line 294, line 256 to the anode of diode 278 which conducts anode to cathode and applies the transient to the cathode of diode 284 whose anode is connected via line 292 to the chassis ground conductor 230. A negative voltage surge pulse applied to the chassis ground conductor 230 is directly connected to the system ground via line 236 and ground connection 238. This circuit provides surge protection for line to line, line to shield and line to ground.

While there have been shown and described and pointed out the fundamental novel features of the invention as applied to the preferred embodiments, as are presently contemplated for carrying them out, it will be understood that various omissions and substitutions and changes of the form and details of the devices illustrated and in their operation may be made by those skilled in the art, without departing from the spirit of the invention.

We claim:

1. A data surge protection module comprising:
   a housing;
   a printed circuit board within the housing and having:
   a termination line for terminating a data line of the module,
   a first signal line;
   a second signal line;
   a common return line for said first and second signal lines;
   a shield line; and
   a chassis ground line;
   an avalanche diode having first and second terminals;
   a first diode bridge having:
   a first, second, third and fourth diodes;
   an input terminal connecting the first and second diodes to the common return line for the first and second signal lines;
   an output terminal connecting the third and fourth diodes to the termination line;
   a first bridging terminal connecting the first and third diodes to the first terminal of the avalanche diode; and
   a second bridging terminal connecting the second and fourth diodes to the second terminal of the avalanche diode;
   a second diode bridge having:
   a first, second, third and fourth diodes;

an input terminal connecting the first and second diodes to the first signal line;

an output terminal connecting the third and fourth diode to the second signal line;

a first bridging terminal connecting the first and third diodes to the first bridging terminal of said first diode bridge and to the first terminal of the avalanche diode;

a second bridging terminal connecting the second and fourth diodes to the second bridging terminal of said first diode bridge and to the second terminal of the avalanche diode;

a third diode bridge having:

a first, second, third and fourth diodes;

an input terminal connecting the first and second diodes to the shield line;

an output terminal connecting the third and fourth diode to the chassis ground line;

a first bridging terminal connecting the first and third diodes to the first bridging terminal of said second diode bridge and to the first terminal of said avalanche diode: and a second bridging terminal connecting the second and fourth diodes to the second bridging terminal of said second diode bridge and to the second terminal of said avalanche diode.

\* \* \* \* \*